United States Patent [19]
Nomizu

[11] Patent Number: 5,406,282
[45] Date of Patent: Apr. 11, 1995

[54] DATA CODING AND DECODING WITH IMPROVED EFFICIENCY

[75] Inventor: Yasuyuki Nomizu, Ebina, Japan

[73] Assignee: Ricoh Company, Ltd., Tokyo, Japan

[21] Appl. No.: 966,323

[22] Filed: Oct. 26, 1992

[30] Foreign Application Priority Data

Nov. 5, 1991 [JP] Japan .................................. 3-315254

[51] Int. Cl.$^6$ ............................................. H03M 7/30
[52] U.S. Cl. ........................................ 341/65; 341/51; 341/107
[58] Field of Search ................. 341/51, 65, 67, 107

[56] References Cited

U.S. PATENT DOCUMENTS

| | | | |
|---|---|---|---|
| 3,701,111 | 10/1972 | Cocke et al. | 341/67 |
| 4,286,256 | 8/1981 | Langdon et al. | |
| 4,295,125 | 10/1981 | Langdon, Jr. | 341/50 |
| 4,396,906 | 8/1983 | Weaver | 341/65 |
| 4,467,317 | 8/1984 | Langdon, Jr. et al. | 341/65 |
| 4,652,856 | 3/1987 | Mohiuddin et al. | |
| 4,700,175 | 10/1987 | Bledsoe | 341/65 |
| 4,749,983 | 6/1988 | Langdon, Jr. | 341/51 |
| 4,905,297 | 2/1990 | Langdon, Jr. et al. | 382/56 |
| 5,023,611 | 6/1991 | Chamzas et al. | 341/51 |
| 5,045,852 | 9/1991 | Mitchell et al. | 341/51 |
| 5,138,316 | 8/1992 | Konishi | 341/67 |
| 5,225,832 | 7/1993 | Wang et al. | 341/67 |

OTHER PUBLICATIONS

Pennebaker, et al., "An overview of the basic principles of the Q-Coder adaptive binary arithmetic coder", IBM J. Res. Develop. vol. 32 No. 6, Nov. 1988, pp. 717-726.

Langdon, et al., "Compression of Black-White Images with Arithmetic Coding", IEEE Transactions Communications, vol. COM-29, No. 6, Jun. 1981, pp. 858-867.

Primary Examiner—Marc S. Hoff
Attorney, Agent, or Firm—Oblon, Spivak, McClelland, Maier & Neustadt

[57] ABSTRACT

An appearance probability forecasting device forecasts an appearance probability that a symbol described by data will be a predetermined symbol. An initial value varying device varies an initial value of the appearance probability in accordance with the type of the data. A coding device codes the data, based on the initial value of the appearance probability, the symbols actually described by the data, and the appearance probability forecast by the appearance probability forecasting device.

52 Claims, 12 Drawing Sheets

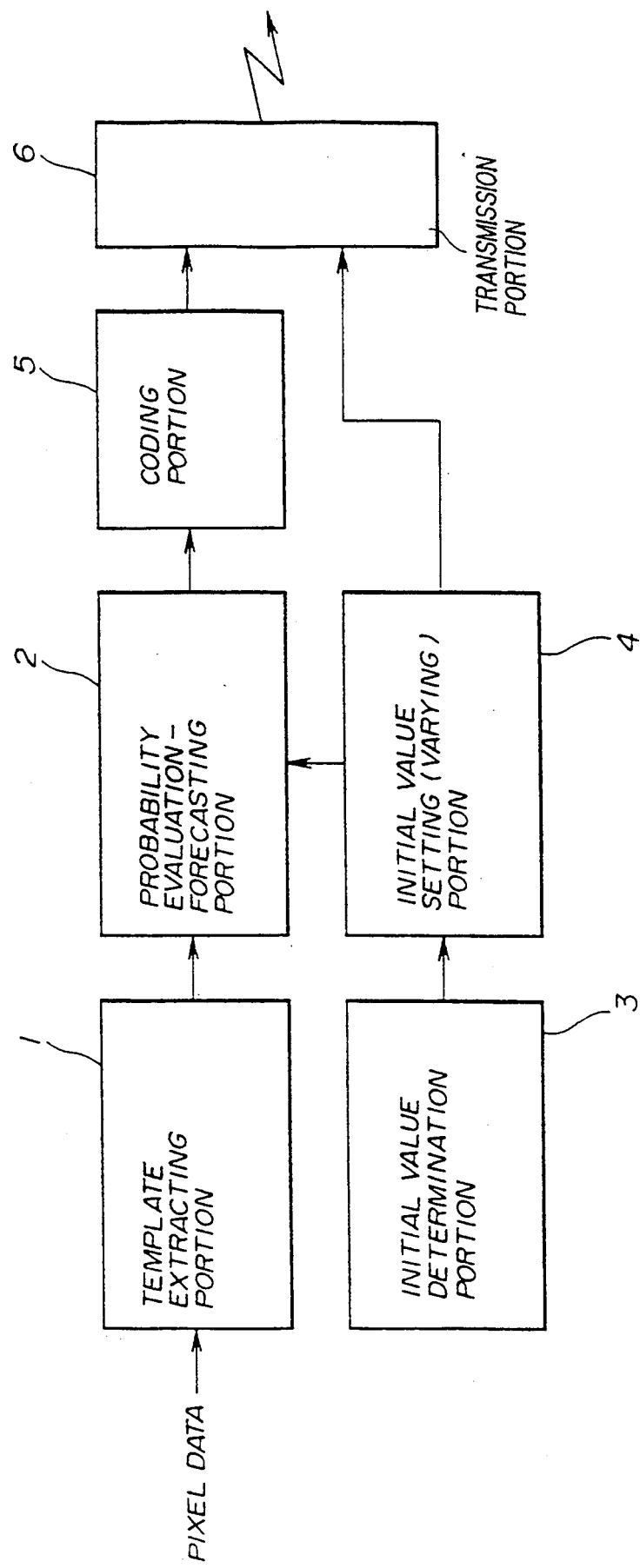

FIG. 11  NUMBER LINE →

DATA CODING AND DECODING WITH IMPROVED EFFICIENCY

BACKGROUND OF THE INVENTION

The present invention relates to a data coding apparatus and method, and a data decoding apparatus and method wherein an arithmetic coding system is used for a data compression process and a data expansion process (reproducing process for obtaining original data, that is, data as it is before it is compressed) for image information.

The arithmetic coding system has recently drawn attention, which system is a forecast coding system for coding image information.

The arithmetic coding system is described below with reference to FIG. 11. For example, data to be coded is a series of binary bits such as "0", "0", "1", "0", "0", which are shown in a bottom of FIG. 11. FIG. 11 shows a process of data coding from left to right of FIG. 11. In this case, a least probability symbol (this is referred to as "LPS" hereinafter) is assigned to a symbol "1". The LPS should be determined to be assigned to the symbol which has the lowest probability of appearing in the data. A most probability symbol (this is referred to as "MPS" hereinafter) is then assigned to another symbol "0". The MPS should be determined to be assigned to the symbol which has the highest probability of appearing in the data.

Then, an LPS appearance probability is determined to be 0.3. Thus, the number line between 0 and 1, as shown drawn from bottom to top in FIG. 11, is divided into 0.3 and 0.7(=1−0.3) in accordance with the above mentioned LPS appearance probability "0.3". An segment $A_0.1$ located at the top left of FIG. 11 having a length of 0.3 is the segment for the LPS "1", another segment $A_0.0$ located at the bottom left of FIG. 11 having a length of 0.7, is a segment for the MPS "0". Then, the first data is the symbol "0" (MPS), thus the segment $A_0.0$ is selected.

Then, the vertical length between the top and bottom of the segment $A_0.0$ is again divided into 0.3 and 0.7, and resulting segments are $A_1.1$ for the LPS "1" and $A_1.0$ for the MPS "0". The second data also is the symbol "0" (MPS), thus the segment $A_1.0$ is selected. Then, the length of the segment $A_1.0$ is again divided into 0.3 and 0.7, and the resulting segments are $A_2.1$ for the LPS "1" and $A_2.0$ for the MPS "0". The third data is the symbol "1" (LPS), thus, in this case, the segment $A_2.1$ is selected.

As a result of repeating the data coding processes mentioned above, the length of the segment selected becomes gradually shorter as shown in FIG. 11 (The length of the hatched segment becomes shorter from left to right.). Coded data is determined to describe a position on the number line between 0 and 1, which position is finally selected by the end of the data coding process. For example, in this case, the segment $A_4.0$ is finally selected, which segment is positioned about 0.4 on the number line. Thus, the coded data is for example determined to be "0.4".

In the data decoding process, the original data "0", "0", "1", "0", and "0" is obtained from the coded data 0.4 and the LPS appearance probability "0.3". Therefore, the above mentioned original data is compressed to become the appearance probability and the coded data.

The above-mentioned process with regard to the arithmetic coding system is executed based on a forecast value in the case where image information is coded by means of the arithmetic coding system. The forecast value is obtained as a result of the following process. An LPS appearance probability is forecast based on the pixel data of pixels surrounding a pixel, the data of which pixel is to be coded. This forecasting is executed while the pixel data of the pixels of each line, which pixel data are to be coded, are successively provided, which pixel data constitute the symbol succession. A constant initial value acting as the initial forecast value of the LPS appearance probability mentioned above is predetermined before the arithmetic coding process is started.

The number of data bits comprising the code generated as the result of the above mentioned arithmetic coding system is reduced as the forecast value of the LPS appearance probability approaches the actual appearance probability. This results in an improved coding efficiency.

The initial forecast value of the appearance probability is normally predetermined to be "0.5" because it cannot be forecast. The value "0.5" is determined under the assumption that the appearance probabilities of the most probability symbol (this is referred to as "MPS" hereinafter) and the LPS are equal to each other. The word "appearance probability" means the probability that data will describe the MPS or the LPS.

However, such appearance probabilities vary depending on the type of image to be processed. For example, the LPS (corresponding to a dark pixel in this example) appearance probability for a picture image having light and dark parts may be high such as "0.5". On the other hand, one for characters may be low such as "0.2".

For example, there may be a case where: an image resulting in a low LPS appearance probability such as a picture image is processed; and the initial forecast value of an appearance probability of the LPS is predetermined to be "0.5". In this case, the forecast value of an LPS appearance probability gradually approaches the actual appearance probability from the initial forecast value "0.5" as shown in FIG. 1, as coding proceeds.

The forecast value of the LPS appearance probability seems to vary gradually in FIG. 1, but it actually varies in steps, one step for each pixel, or one step for each plurality of pixels.

However, in this case, the coding efficiency is degraded as the result of the large number of data bits being generated during a constant period until the forecast value approaches the actual appearance probability. As a result, during that period, the process speed may be slow.

Further, such an initial forecast value is independently determined each time before the start of each page to be processed in the related art (this means the art related to the present invention hereinafter) in the case where coding is performed on images on a plurality of pages. In this case, the degrading of coding efficiency mentioned above occurs each time the coding process is performed on a page.

The above-mentioned related art has a problem in that an efficient execution of the coding and/or decoding process for image information can not be realized because the coding efficiency is degraded depending on the type of image to be processed as mentioned above.

SUMMARY OF THE INVENTION

An object of the present invention is to provide a coding system and a decoding system respectively involving the arithmetic coding system, wherein an efficient execution of a coding process and a decoding process for image information can be realized even if the image information to be processed corresponds to any type of image.

To achieve the object of the present invention, a data coding apparatus comprises:

appearance probability forecasting means for forecasting an appearance probability that a symbol described by data will be a predetermined symbol;

initial value varying means for varying an initial value of the appearance probability according to the type of data; and coding means for coding the data so as to provide coded data, based on the initial value of the appearance probability, the symbols actually described by the data, and the appearance probability forecast by the appearance probability forecasting means.

Also, a data decoding apparatus comprises:

appearance probability forecasting means for forecasting an appearance probability that a symbol described by coded data will be a predetermined symbol;

initial value varying means for varying an initial value of the appearance probability according to the type of the original data obtained as a result of decoding of the coded data; and decoding means for decoding the coded data so as to provide original data, based on the initial value of the appearance probability, the symbols actually described by the original data, and the appearance probability forecast by the appearance probability forecasting means.

In the above mentioned composition, an efficient execution of the coding and/or decoding process can be realized. This is because an initial forecast value of an appearance probability, which value is near to a corresponding actual value, is set when the coding or decoding process is started. Thus, the error present in the forecast value of the appearance probability during a constant period from the beginning of the process, which error is such as the difference from the corresponding actual value, can be minimized.

Further, in the above mentioned data coding apparatus, the data is processed for each page, and the initial value varying means sets a respective initial value of an appearance probability for each page in a first case, or the coding means uses an appearance probability obtained in the process of data coding for a current page, for the data coding for a next page in a second case.

Also, in the above-mentioned data decoding apparatus, the data is processed for each page, and the initial value varying means sets a respective initial value of an appearance probability for each page in a first case, or the decoding means uses an appearance probability obtained in a process of data coding for a current page, for data coding for a next page in a second case.

In the above mentioned composition, an efficient coding and/or decoding process for each page of original data to be processed can be realized. This is because an appropriate initial forecast value of an appearance probability is set again every time a coding and/or decoding process for a next page is started after the process mentioned above for one page is completed.

Other objects and further features of the present invention will become more apparent from the following detailed description when read in conjunction with the accompanying drawings.

BRIEF DESCRIPTION OF THE DRAWINGS

FIGS. 2A and 2B show block diagrams of an image transmission apparatus of the first, second and third embodiments according to the present invention;

FIG. 11 shows an illustration of a principle of an arithmetic coding system.

DESCRIPTION OF THE PREFERRED EMBODIMENTS

Embodiments according to the present invention are described below.

A block composition of a transmission side of an image transmission apparatus of a first embodiment of the data coding apparatus or method according to the present invention is described below with reference to FIG. 2A. Pixel data of an image to be transmitted is supplied to a template pixel extracting portion 1. The template pixel extracting portion 1 extracts pixel data corresponding to a plurality of surrounding pixels which are located in positions around the notice pixel which is to be coded and positions of which pixels have predetermined relationships to a position of the notice pixel. A probability evaluation-forecasting portion 2 executes a forecasting operation so as to obtain a forecast value of an LPS appearance probability based on the data of the above mentioned surrounding pixels. The probability evaluation-forecasting portion 2 acts as appearance probability means. One of various types of initial forecast values acting as the forecast value of the appearance probability such as mentioned above is set in the probability evaluation-forecasting portion 2 when the above mentioned forecasting operation is started.

Figure 12:
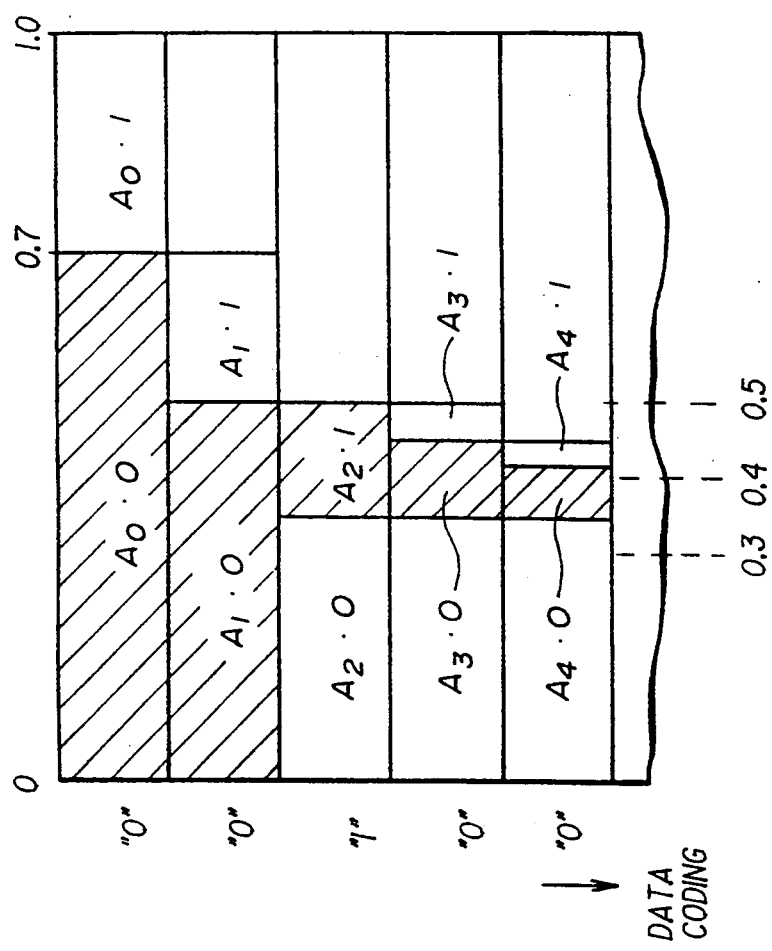
FIG. 12 shows an example of surrounding pixels for a pixel to be coded, which surrounding pixels are used for forecasting of an appearance probability.

Further, the above-mentioned surrounding pixels for forecasting an LPS or MPS appearance probability are, for example, such as the 10 pieces numbered "0" through "9" shown in FIG. 12. The coded data is hatched in FIG. 12. In a data coding process for a two-dimension image, each pixel is coded, for example, from the pixel located at the top left, proceeding along the top line, proceeding with lines from top to bottom, until the pixel located at the bottom right is reached. Thus, for example, in a process for a pixel located in the top line, most of the surrounding pixels shown in FIG. 12 do not exist. In such a case, such surrounding pixels are assumed to have, for example, MPS.

Such forecasting based on pixel data of the above mentioned surrounding pixels is executed, for example, by using a predetermined reference table showing a relationship between each case of pixel data (for example, "black" or "white") for surrounding pixels and the corresponding appearance probability.

An initial value determination portion 3 determines an initial forecast value of an appearance probability such as mentioned above depending on the type of the image (such as picture image or character image) to be processed. An initial value setting portion 4 sets the initial forecast value determined by the initial value determination portion 3 in the probability evaluation-forecasting portion 2. The initial value determination means 3 and/or the initial value setting portion 4 acts as initial value varying means. A coding portion 5 produces an arithmetic code, that is, coded data as a result of a predetermined arithmetic calculation based on a forecast value such as mentioned above obtained by the probability evaluation-forecasting portion 2. The coding portion 5 acts as coding means. A transmission portion 6 adds other various types of data to coded data produced by the coding portion 5, and then transmits them together acting as transmission data. The transmission portion 6 acts as transmission means.

A block composition of the receiving side of the above mentioned image transmission apparatus of the first embodiment of the data decoding apparatus or method according to the present invention is described below with reference to FIG. 2B. A receiving portion 7 receives transmission data transmitted by the transmission side. The receiving portion 7 acts as a receiving means. A decoding portion 8 reproduces original pixel data from coded data included in transmission data as a result of performing a predetermined arithmetic calculation. The decoding portion 8 acts as decoding means. The original pixel data obtained by the decoding portion 8 is supplied to a template pixel extracting portion 9. The template pixel extracting portion 9 extracts pixel data corresponding to a plurality of pixels surrounding a notice pixel and positions of the pixels having a predetermined relationship to a position of the notice pixel. A probability evaluation-forecasting portion 10 executes a forecasting operation so as to obtain a forecast value of an LPS appearance probability based on pixel data of the above mentioned surrounding pixels. The probability evaluation-forecasting portion 10 acts as appearance probability forecasting means. An initial value setting (varying) portion 11 sets the initial forecast value, which value is included in the transmission data, in the probability evaluation-forecasting portion 10. The initial value setting portion 11 acts as initial value varying means.

Figure 3:
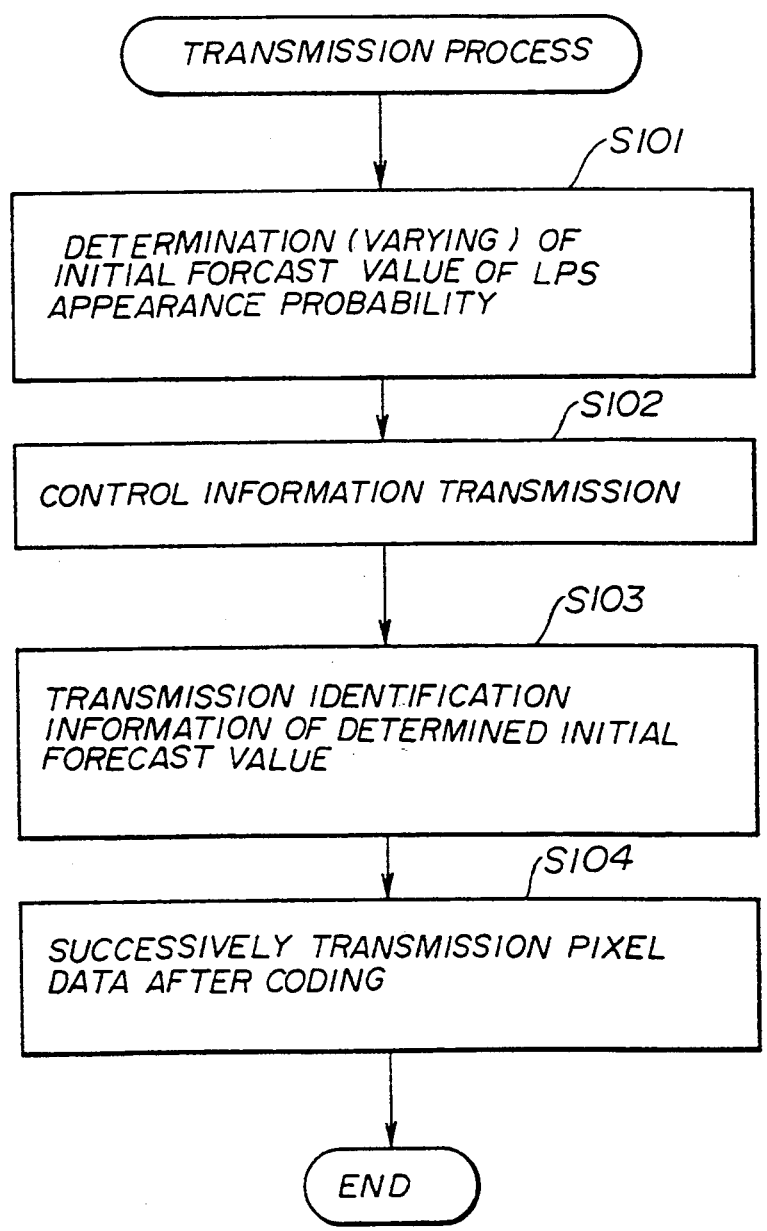
FIG. 3 shows an operation flow chart of the transmission process in the image transmission apparatus of the first embodiment according to the present invention.

The operation flow of operation of the transmission side of the image transmission apparatus of the first embodiment, the composition of which is described above, is described below with reference to FIG. 3.

When a transmission process is started, an initial forecast value of the LPS appearance probability of the image data to be processed is determined by the initial value determination portion 3 in a step (the word "step" is omitted for the sake of simplification) S101. This determination is in this case, by way of example, executed in accordance with a determination by an operator. This determination by the operator is done depending on the type of image to be processed. That is, the operator determines the initial forecast value to be, for example, "0.5" if the image to be processed is a picture image having light and dark parts, and, for example, "0.2" if the image is a character image.

Such determination is not limited to determination by an operator, but another method can be allowed such that an apparatus automatically roughly scans all documents to be coded so as to determine the types of images in the documents.

Figure 4:
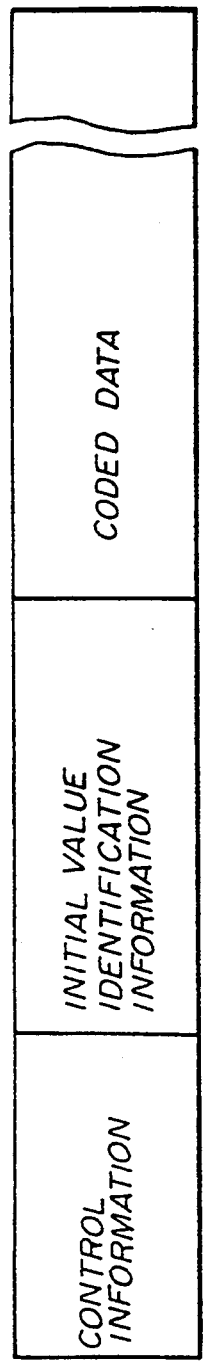
FIG. 4 shows an illustration of transmission data in the image transmission apparatus of the first embodiment according to the present invention.

Then, the transmission portion 6 starts data transmission in S102. The transmission portion 6 transmits control information at a start of the transmission data as shown in FIG. 4. This control information is notice information for the receiving side which receives transmission data such as mentioned above. This control information includes, for example, the size of the original image, the resolution of the original image, and other various types of information as occasion demands. Then, identification information corresponding to an initial forecast value such as that determined in S101 is transmitted in S103.

Then, pixel data is supplied, the supplied pixel data is successively coded, and coded data obtained as a result of the coding mentioned above is thus transmitted, in S104. That is, in this case, the template pixel extracting portion i extracts pixel data corresponding to pixels surrounding a notice pixel, and in positions having a predetermined relationship to the notice pixel. This notice pixel is successively assigned to each pixel in the supplied pixel data. Then, data for each notice pixel with surrounding pixels as mentioned above is supplied to the probability evaluation-forecasting portion 2. The probability evaluation-forecasting portion 2 determines an MPS assignation with respect to each notice pixel such as whether the MPS of a notice pixel such as mentioned above is "black" or "white", and the portion 2 forecasts an LPS appearance probability. An LPS is determined to be "white" if the MPS is determined to be "black", and the LPS is determined to be "black" if the MPS is determined to be "white" in this case. The coding portion 5 produces an arithmetic code (coded data) as a result of performing a predetermined arithmetic coding with the MPS assignation and the LPS appearance probability determined by the probability evaluation-forecasting portion 2. Then an arithmetic code acting as coded data such as that produced by the coding portion 5 is transmitted by the transmission portion 6.

In the actual data coding process in accordance with the arithmetic coding system, a number line between 0 and 1 is divided in accordance with the ratio of the above mentioned initial value of the LPS appearance probability, for example as shown in FIG. 11. Then, one of the divided segments of the number line is selected in accordance with the actual symbol (white or black) of the first scanned pixel to be coded. Then, the selected segment is again divided in accordance with the ratio of the above-mentioned forecast LPS appearance probability. Then, one of divided segments of the number line is selected in accordance with the actual symbol (white or black) of each pixel to be coded, which pixels are scanned after the first pixel. A code indicating the position of the segment on the number line finally selected as a result of this repeated process of dividing the selected segment and selecting one of the divided sections, is determined as the coded data.

Which symbol "white" or "black" is assigned as LPS is initially determined but it may vary in the coding process depending on the actual symbols of pixels being coded. For example, the initial LPS is determined to be "black" but the LPS is set to the "white" symbol when the actual image being coded is a dark one so that the number of black pixels is greater than the number of white pixel in the coding process.

Further, the length of the selected segment is described by a binary decimal fraction. The binary decimal fraction is such that a decimal fraction is described by the following formula:

$$B_1*\{\tfrac{1}{2}\}+B_2*\{1/(2^2)\}+B_3*\{1/(2^3)\}+\ldots,$$

then, $B_1\ B_2\ B_3\ldots$ is a corresponding binary decimal fraction.

Further, when the length of the selected segment in the data coding process becomes less than a predetermined length, for example, "0.75", then the length of the selected segment is approximated by "1.0" for the sake of simplicity of calculation in the coding process. Such approximating is performed by left bitwise sifting of the binary decimal fraction until the length becomes more than "0.75". A bit overflowing on the left side of the binary decimal fraction can be treated as a bit already determined as coded data. Further, determined bits such as mentioned above are transmitted when the number of the bits being accumulated becomes equal to a predetermined number, for example "8" bits.

Information such as that transmitted in S101, S103 and S104 is referred to as transmission information.

Figure 5:
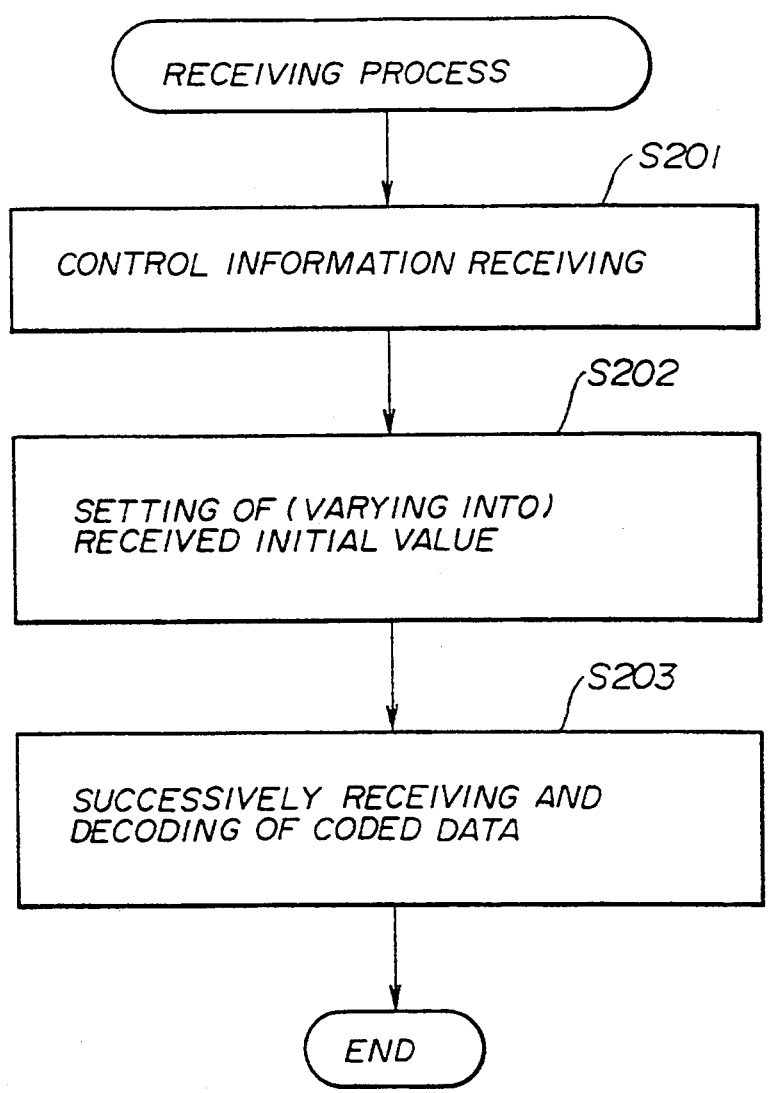
FIG. 5 shows an operation flow chart of a receiving process in the image transmission apparatus of the first embodiment according to the present invention.

The flow of operation of the receiving side of the image transmission apparatus of the first embodiment, the composition of which is described above, is described below with reference to FIG. 5.

Control information of transmission data such as mentioned above but, of course, transmitted from the transmission side of another image transmission apparatus having a composition similar to the above-mentioned transmission side of the image transmission apparatus, is received by the receiving portion 7 in S201, then each portion of the receiving side prepares for data receiving. Then, the receiving portion 7 receives the initial forecast information such as mentioned above of the transmission data, the initial value setting portion 11 then sets an initial forecast value such as mentioned above in (for) the probability evaluation-forecasting portion 10 in S202.

Then, receiving of coded data is started, received coded data is then successively decoded, and pixel data obtained as a result of decoding is thus provided, in S203. That is, in this case, received coded data is supplied to the decoding portion 8, the decoding portion 8 then successively reproduces pixel data based on the forecast value supplied from the probability evaluation-forecasting portion 10. The template pixel extracting portion 9 extracts pixels surrounding a notice pixel such as mentioned above each time one bit of pixel data is reproduced by the decoding portion 8, which notice pixel corresponds to the bit of pixel data mentioned above. The probability evaluation-forecasting portion 10 executes the following operations with respect to each bit of pixel data. The portion 10 determines whether the MPS is "black" or "white", and forecasts an LPS appearance probability. Thus, reproduced pixel data is provided.

In the actual decoding process, a real line such as mentioned above is divided into two segments in a ratio determined by the above mentioned initial value of LPS appearance probability. Then, one of the divided segments is selected in accordance with the symbol "black" or "white" of the first pixel, which symbol should be obtained by referring to the corresponding coded data received. Then, the selected segment is again divided into two segments in a ratio determined by the above mentioned forecast LPS appearance probability. Then, one of the divided segments is again selected in accordance with the symbol "black" or "white" of each pixel scanned after the first pixel, which symbols should be obtained by referring to the corresponding coded data received. As a result of such a repeated process of dividing a selected segment and selecting one of the divided segments, symbols are obtained, which symbols should be obtained by referring to the corresponding coded data received.

In this embodiment, a transmission process and receiving process such as mentioned above with reference to FIGS. 3 and 5, are respectively independently executed for each page of an image.

Figure 6:
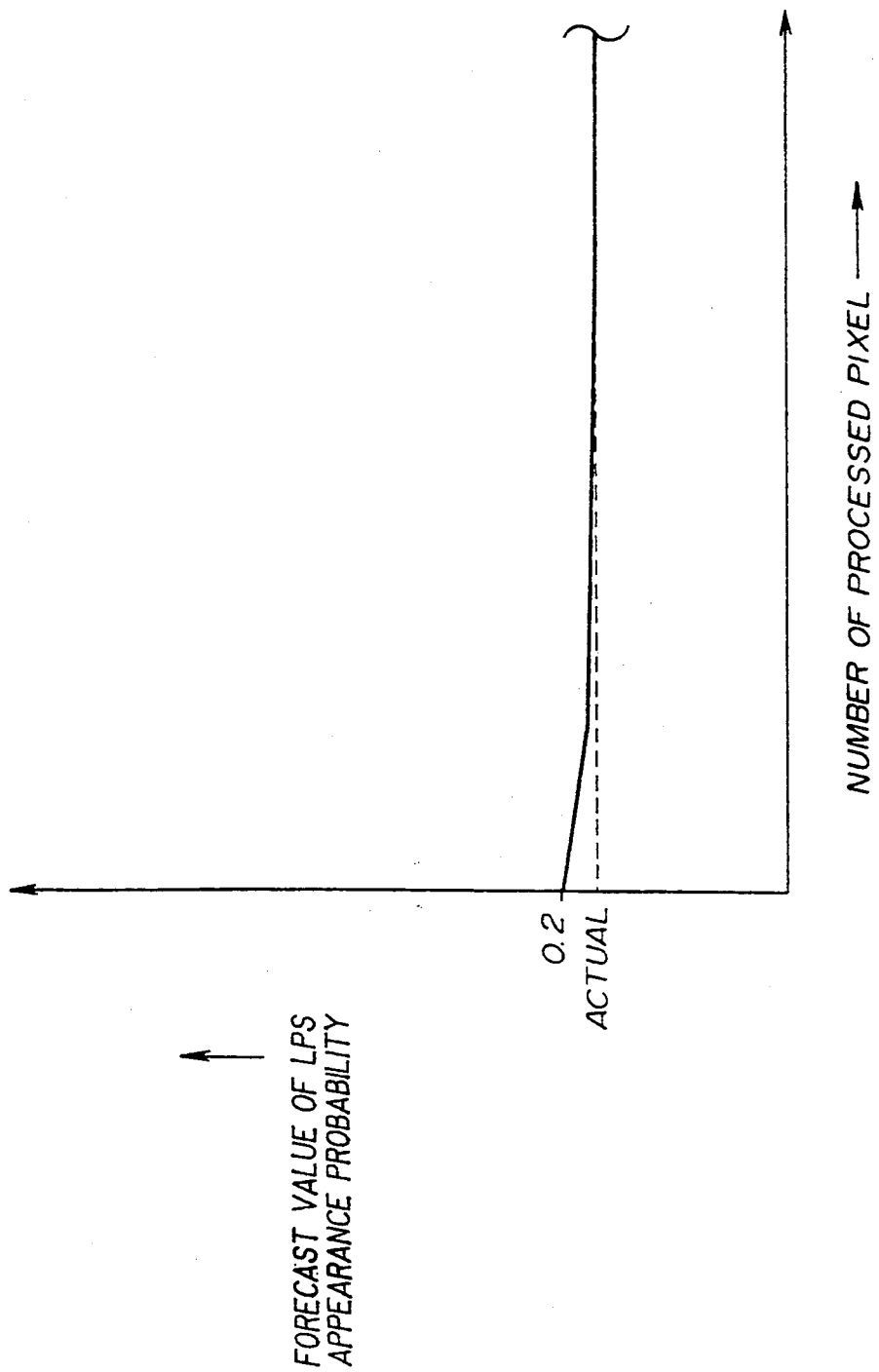
FIG. 6 is a graph showing the variation of a forecast value of an LPS appearance probability versus the number of processed pixels in the coding and/or decoding process in the present invention.

Each of probability evaluation-forecasting portions 2 and 10 updates a forecast value of an LPS appearance probability in accordance with an actual LPS appearance probability of pixel data. There may be a case as shown in FIG. 6 where the initial forecast value of an LPS appearance probability is set to "0.2", and the actual forecast value of the LPS appearance probability is slightly lower than this "0.2". In this case, the forecast value of the LPS appearance probability gradually approaches the actual appearance probability, as shown in FIG. 6, as coding or decoding proceeds.

Figure 1:
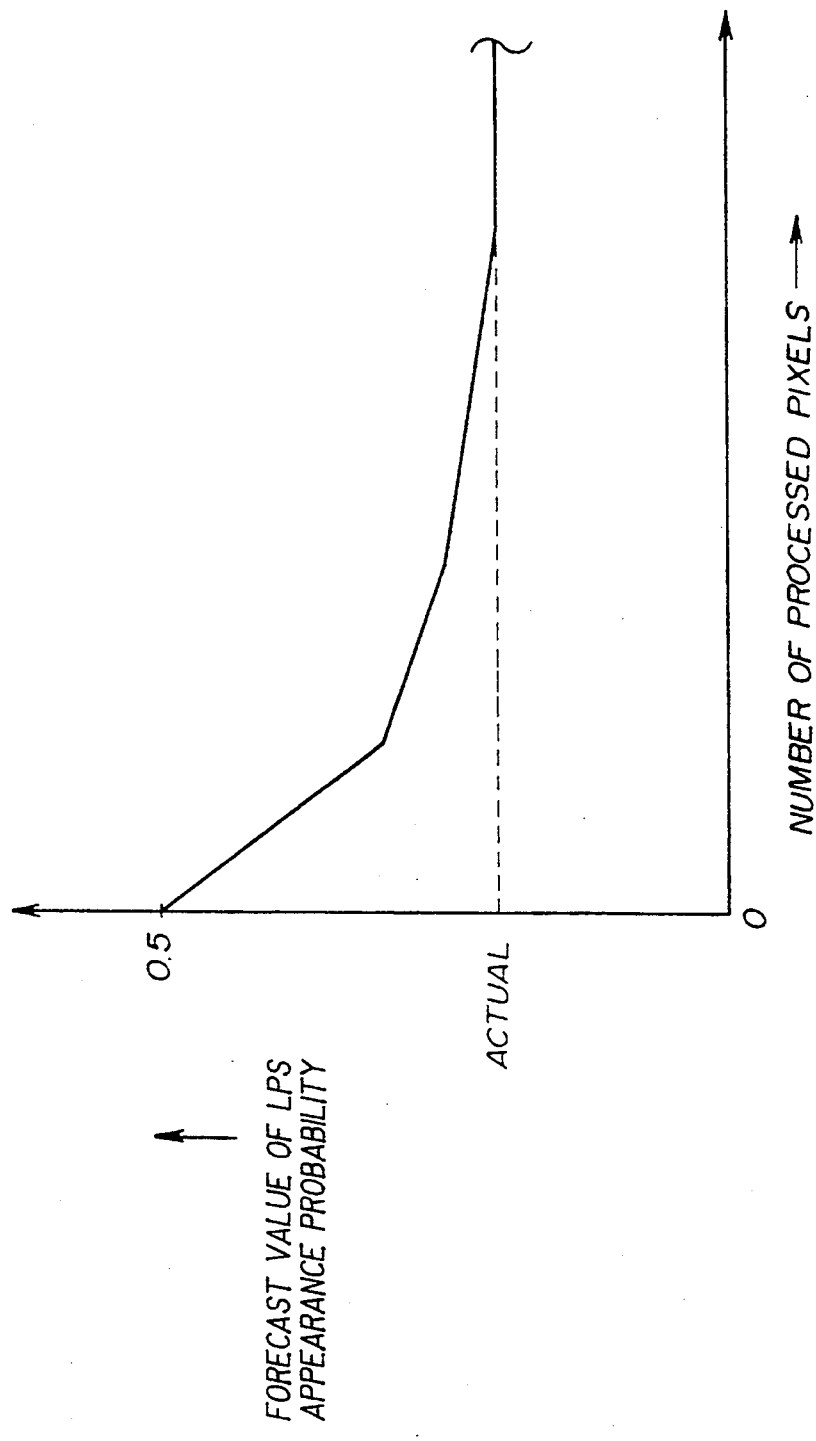
FIG. 1 is a graph showing the variation of a forecast value of an LPS appearance probability versus the number of processed pixels in a coding and/or decoding process in the related art.

In the case in FIG. 6 it is clear when comparing with the case in FIG. 1 that the error present in the forecast value of the LPS appearance probability, which error is the difference from the actual value, can be minimized. This is because the initial forecast value being set is determined to be a value ("0.2") near to the actual value.

An advantage of this embodiment is described below. An efficient execution of the coding process and the decoding process can be realized for all types of images. This is because the initial forecast value of the LPS appearance probability being determined can vary depending on the type of the image to be processed.

Another advantage of the embodiment is that an accurate reproduction from received coded data can be realized at the receiving side. This is because the transmission side transmits an initial forecast value which is determined and then set in the transmission side, to the receiving side. Thus, the receiving side can set the same initial forecast value in the receiving side as that set in a transmission side, even if the transmission side varies the initial forecast value at random every image transmission.

The method in this embodiment for determination of an initial forecast value is not limited to a method such that, for example, an operator determines an initial forecast value in accordance with an image to be processed as mentioned above, and another method is allowed such that a hardware determines an initial forecast value automatically in accordance with an image to be processed by determination of the type of the image, by preliminarily roughly scanning the image.

Further, the setting of the appearance probability in this embodiment is not limited to the setting of the LPS appearance probability, and setting of the appearance probability of the MPS is allowed for processing similarly to the case applying the setting of the LPS appearance probability because the result of adding of both the appearance probabilities of the LPS and the MPS together is "1".

An image transmission apparatus of a second embodiment of the data coding apparatus or method, and the data decoding apparatus or method according to the present invention is described below.

Figure 2B:
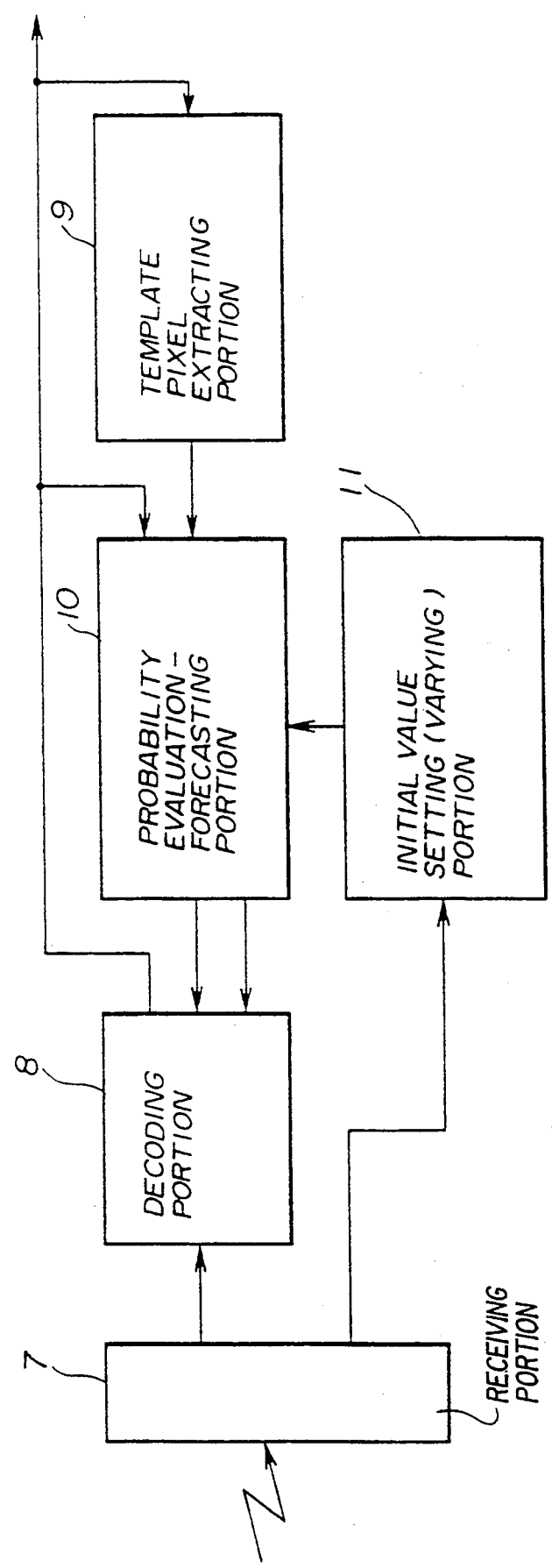

The image transmission apparatus of the second embodiment has the same composition as that of the image transmission apparatus of the first embodiment as shown in FIGS. 2A and 2B except for the part of the operation when a plurality of pages of images are transmitted.

Figure 7:
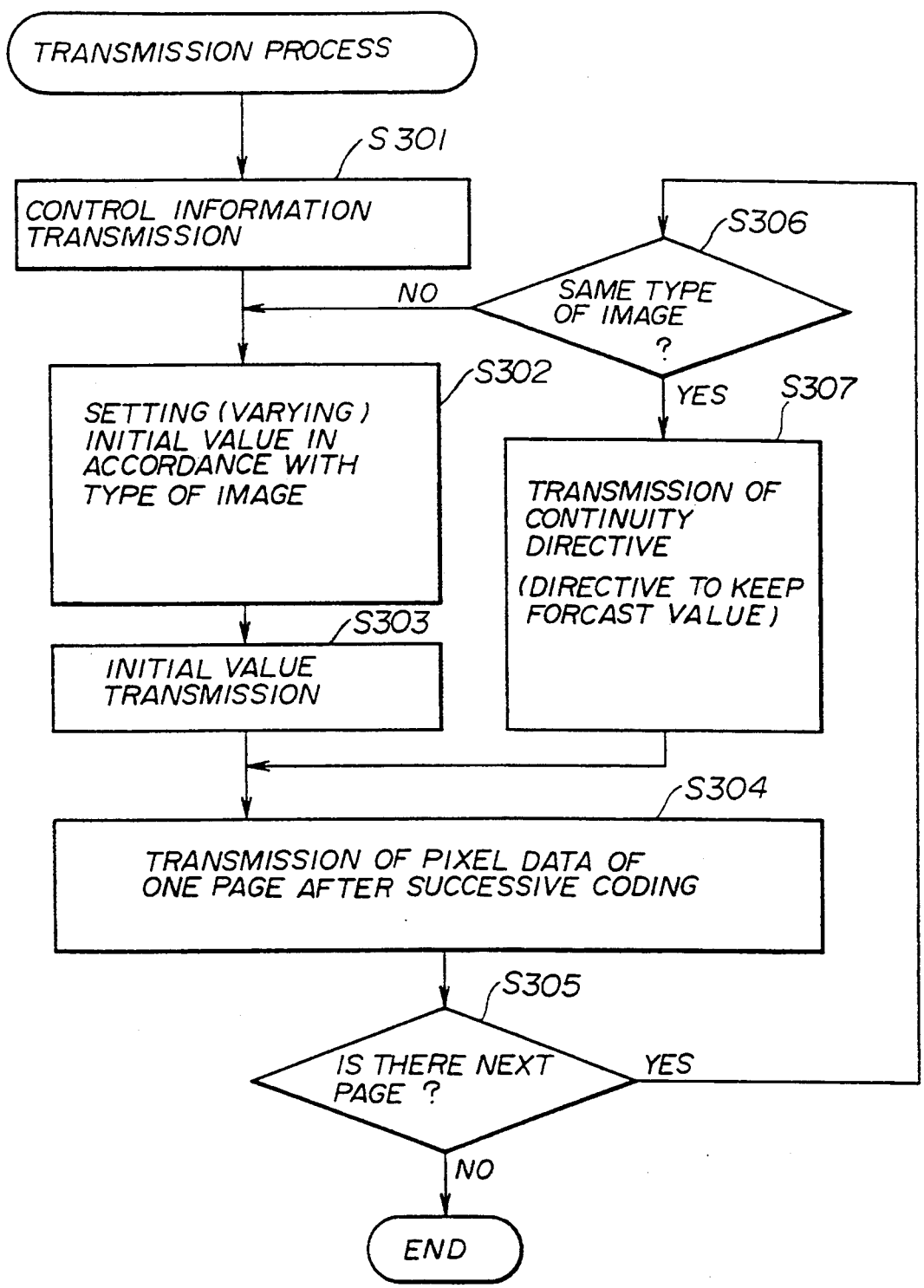
FIG. 7 shows an operation flow chart of a transmission process in the image transmission apparatus of the second embodiment according to the present invention.
Figure 8:
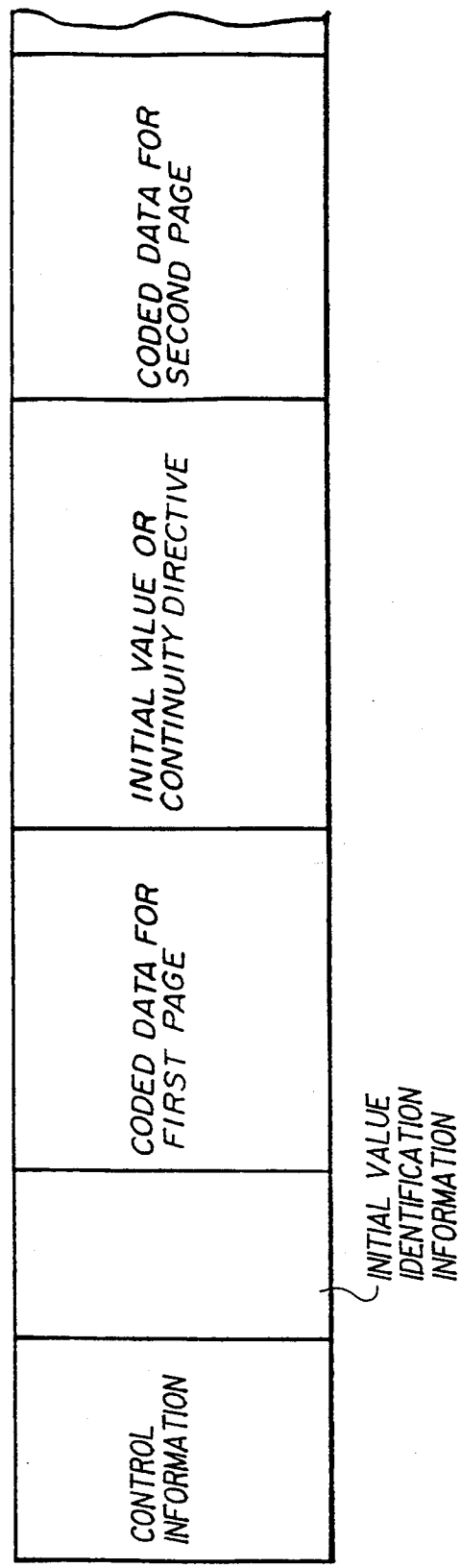
FIG. 8 shows an illustration of transmission data in the image transmission apparatus of the second embodiment according to the present invention.

The flow of operation of a transmission process of the image transmission apparatus of the second embodiment is described below with reference to FIG. 7. The transmission side transmits control information in S301 when the operation of a transmission process is started. Then, an initial forecast value being determined in correspondence with the type of one page of an image is set in the probability evaluation-forecasting portion 2 in S302. Then, the transmission side transmits the set initial forecast value in S303. Then, pixel data corresponding to one page of an image is transmitted after the pixel data is successively coded in S304. Transmission data in this case shown in FIG. 8 comprises contents similar to that in the case of the first embodiment up to data for the first page.

In this second embodiment, it is determined whether or not a next page to be processed exists, in S305, after completion of data transmission for the first page. Then, it is determined whether or not the type of the image of the next page to be processed is the same as that of the image of the current page, data for which image of the first page is currently transmitted in S306 if the next page of the image exists. The words "the type of the image" have a similar meaning to the case of determination of an initial forecast value in the first embodiment, namely whether it is a picture image, a character image, or an image of a combination of pictures and characters.

Then, a continuity directive is transmitted in S307 if the type of the next page of the image is the same as that of the current page of the image ("YES" in S306). The continuity directive indicates to keep the forecast value of the LPS appearance probability without re-initializing it (setting (varying into) another one). Then, pixel data corresponding to the next page of the image is transmitted after successive coding of the pixel data in S304.

On the other hand, if the type of the next page of the image is different from that of the current page ("NO" in S306), the following operation is then executed. An initial forecast value is determined similarly to the operation for the first page of the image in accordance with the type of the next page of the image in S302. Then, pixel data is transmitted after coding the pixel data in S304 after the initial forecast value is transmitted in S303. After the operations mentioned above are executed for all pages of images to be processed, the operation of the transmission process is thus finished.

Figure 9:
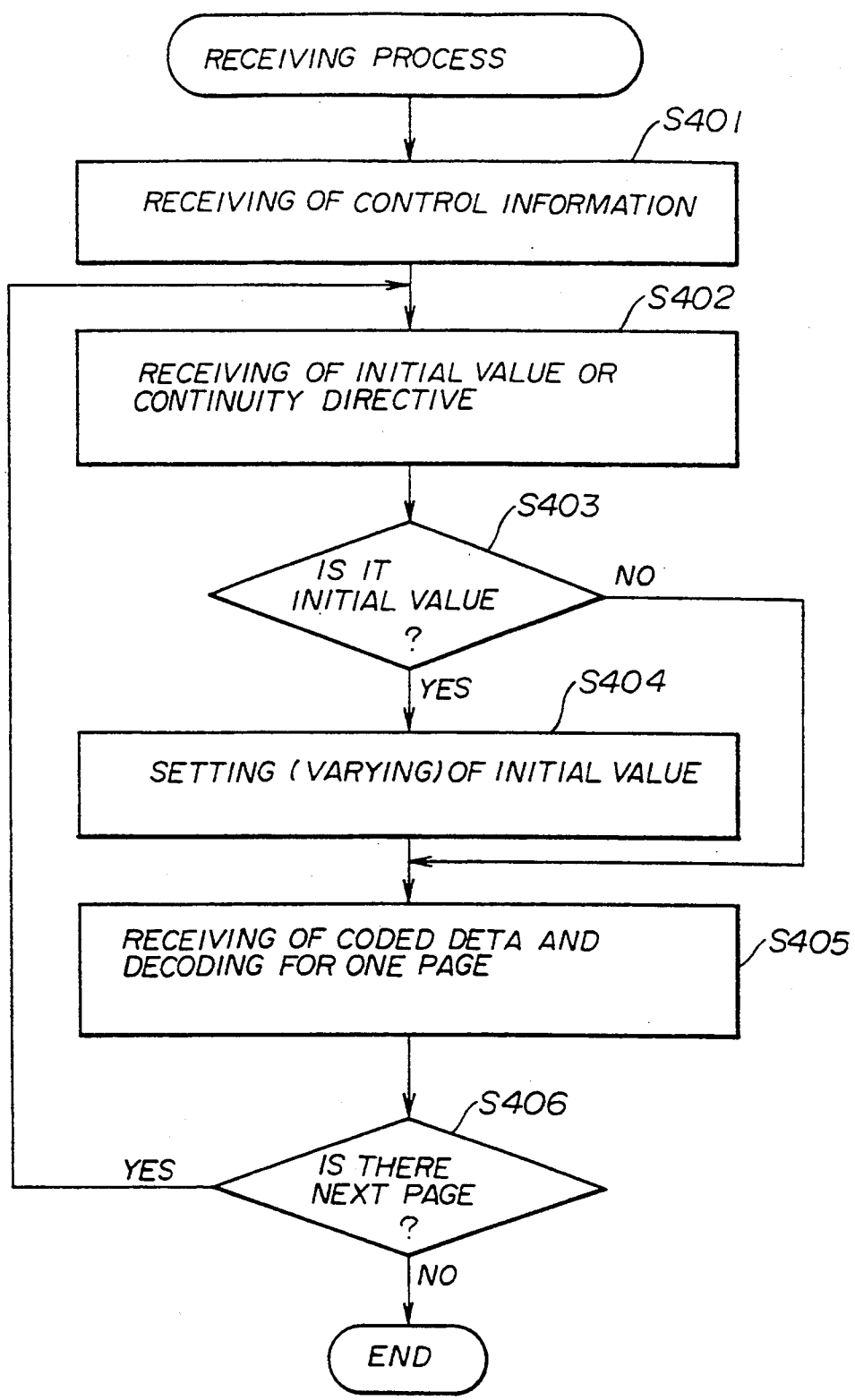
FIG. 9 shows an operation flow chart of a receiving process in the image transmission apparatus of the second embodiment according to the present invention.

The flow of operation of a receiving process of the image transmission apparatus of the second embodiment is described below with reference to FIG. 9. Each portion prepares for receiving data as a result of receiving control information in S401. Then, an initial forecast value of an LPS appearance probability or a continuity directive such as mentioned above is received in S402. Then, whether or not an initial forecast value of an LPS appearance probability has been received is determined in S403. The initial value of the LPS appearance probability is set in the probability evaluation-forecasting portion 10 in S404 if the initial forecast value was received ("YES" in S403). The initial forecast value of the LPS appearance probability is necessarily received soon after the beginning of receiving, and the initial forecast value is then set in the probability evaluation-forecasting position 10.

Then, coded data for one page is decoded after receiving it successively in S405. After completion of the process for the one page, whether or not coded data for a next page to be processed exists is determined in S406. Then, an initial forecast value or a continuity directive such as mentioned above is received in S402 if the coded data for the next page exists ("YES" in S406).

A continuity directive is received if the type of the image on the next page is the same as that of the current image. Then, after receiving a continuity directive such as mentioned above ("NO" in S403), coded data for the next page is then decoded in S405 without an initial forecast value being set in the probability evaluation-forecasting portion 10 (thus, the current forecast value is kept in the portion 10).

Then, after the execution of step S406, S402 is executed again for coded data for another page if the coded data for another page exists ("YES" in S406). The above operations are repeated until coded data for all pages of images is processed completely. After completion of operations for all pages ("NO" in S406), the receiving process is then finished.

An advantage of the second embodiment is described below. An efficient execution of the coding of pixel data of each page of an image can be achieved. This is because, as mentioned above, whether or not the type of the current page of an image is the same as that of the next page of an image is transmitted after completion of transmission of data for the current page. Then, if both the types of images are the same as each other, the execution of coding is continued without the initial forecast value of the LPS appearance probability being reset (varied). Thus, the error presented in the forecast value of the LPS appearance probability, which error is the difference from the actual value, is small.

Another advantage of the embodiment is described below. A receiving side can easily and surely reproduce images from the received data even if the transmission side at random transmits data corresponding to various images, the type of each of which images varies for every page. This is because, as mentioned above, the transmission side transmits a continuity directive if the transmission side does not reset (vary) the initial forecast value as a result of determination of image types as mentioned above. Then, the receiving side executes the decoding process under the same conditions as for the corresponding coding process in the transmission side, according to directives transmitted from the transmission side such as the initial forecast value or the continuity directive.

An image transmission apparatus of a third embodiment of the data coding apparatus or method, and data decoding apparatus or method according to the present invention is described below.

The image transmission apparatus of the third embodiment has the same composition as that of the image transmission apparatus of the second embodiment as shown in FIGS. 2A and 2B except for the following point. Whether the initial forecast value of the LPS appearance probability is reset (varied) or not, being determined in the transmission side when data for each page of an image is transmitted, is determined in accordance with a result of a below mentioned mutual communication of a protocol.

Figure 10:
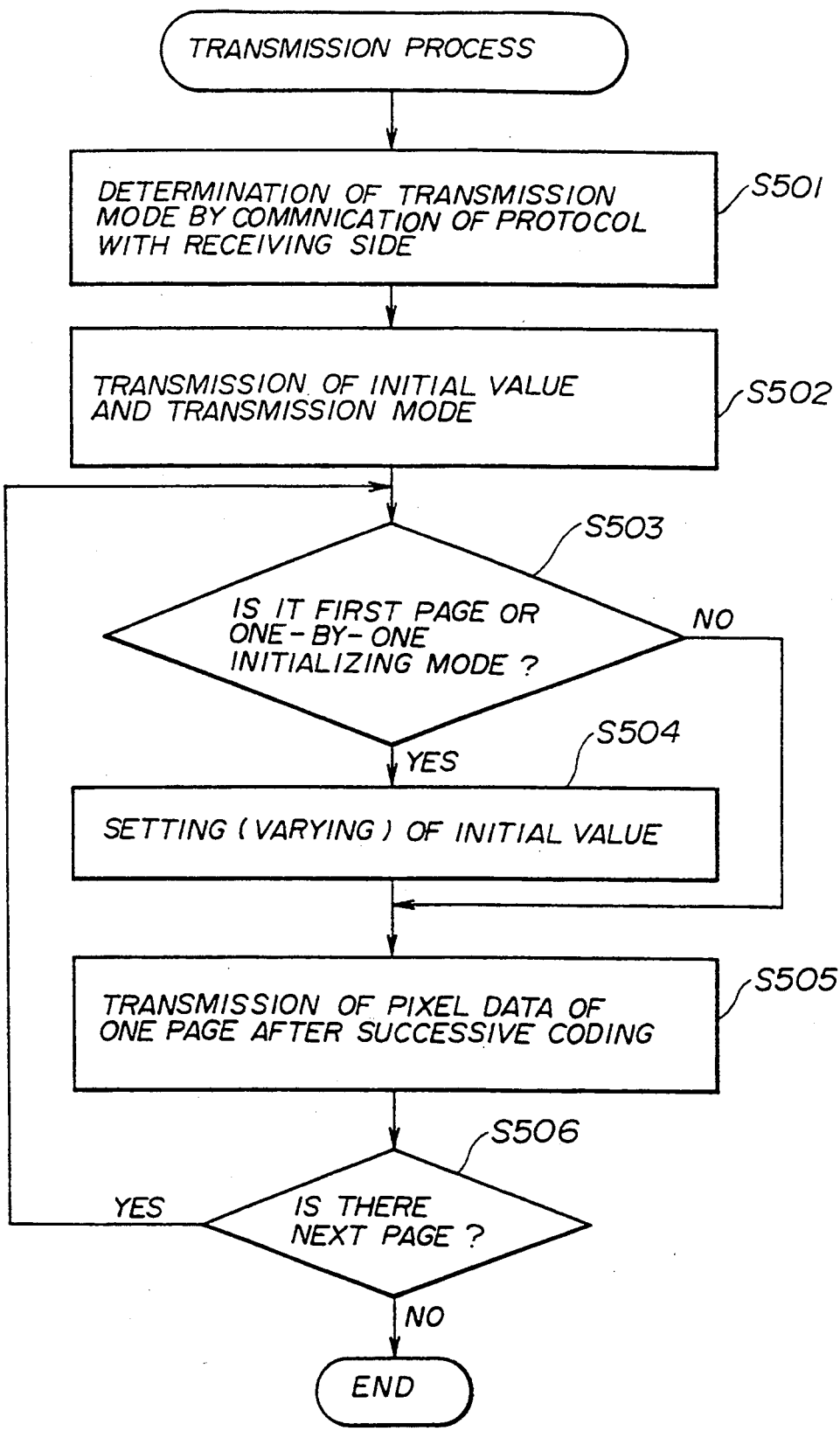
FIG. 10 shows an operation flow chart of a transmission process in the image transmission apparatus of the third embodiment according to the present invention.

The flow of operation in the transmission side is described below with reference to FIG. 10. A transmission mode is determined as a result of the mutual communication of a protocol conducted with a corresponding receiving side in S501 when the operation of a transmission process is started. In this case, the transmission mode can be selected between a one-by-one initializing mode (a first case) and a continuity mode (a second case). In the one-by-one initializing mode, an initial forecast value of an LPS appearance probability is reset (varied) for every page. In the continuity mode, the process of resetting (varying) the initial forecast value of an LPS appearance probability is not executed.

The one-by-one initializing mode is selected if, for example, images to be transmitted comprise a plurality of image types, or if the corresponding receiving side does not have a function such that it can operate in the continuity mode. The continuity mode is selected if images to be transmitted are such that the image type (such as a picture image or a character image) of all pages of images are the same as each other, or if the corresponding receiving side has a function such that the receiving side can operate in the continuity mode.

Such selection is normally determined by the input action of an operator. Such determination is not limited to determination by an operator, but another method can be allowed such that an apparatus automatically roughly scans all documents to be coded so as to determine the type of images of the document.

Then, a predetermined initial forecast value and information describing the transmission mode are transmitted in S502, which mode has been determined as mentioned above in S501.

Determination with regard to the page number of the image to be transmitted and the transmission mode such as mentioned above, is made in S503. Then, if the page of an image to be transmitted is the first page ("YES" in S503), the above mentioned predetermined initial forecast value is set in S504, and pixel data corresponding to one page of an image is then transmitted after coding in S505.

If a next page to be transmitted exists ("YES" in S506), the step S503, determination of a page number and transmission mode, is executed again. Then, if the one-by-one initializing mode has been selected in S501 ("YES" in S503), the predetermined initial forecast value is then reset (varied) in S504, and the next page is processed in S505. If the continuity mode has been selected in S501 ("NO" in S503), the next page is then processed in S505 without resetting (varying) the initial forecast value is set again being executed.

After execution of a step S506, S503 is executed again for another page if the another page to be transmitted exists ("YES" in S506). Operations such as mentioned above are repeated until all pages of images to be transmitted are processed completely. Then, after completion of operations for all pages ("NO" in S506), the transmission process is finished.

The flow of operation in the receiving side of the image transmission apparatus of the third embodiment is described below. An initial forecast value is set in the probability evaluation-forecasting portion 10 after the initial forecast value and information describing a transmission mode such as mentioned above are both transmitted from the corresponding transmission side together. Then, the decoding process for received data for one page of an image is executed. Then, similarly to the operations executed in the transmission side as mentioned above, if the one-by-one initializing mode has been selected as described in the above mentioned received information, the above mentioned received initial forecast value is then reset (varied), and the next page is processed. If the continuity mode has been selected as described in the received information, the next page is then processed without resetting (varying) the initial forecast value. Operations such as mentioned above are repeated until data for all pages of images to be received are processed completely. Then, after completion of operations for all pages, the receiving process is finished.

An advantage obtained in the third embodiment is described below. Image transmission and reception with the appropriate transmission mode corresponding not only to the type of the image to be transmitted but also to the capability of the receiving side apparatus, can be realized. This is because, as mentioned above, whether or not an initialization is executed every page is determined as a result of a mutual communication of a protocol, which communication is performed between the transmission side and the corresponding receiving side at the beginning of a mutual communication for data transmission.

The present invention is not limited to the cases of the above mentioned embodiments where pixel data is transmitted after it is coded, but is allowed to be applied for the following case. Obtained coded data is stored in a storing device, and original pixel data is reproduced from the stored coded data as a result of the stored coded data being read out from the storing device.

Two advantages obtained in the present invention are described below.

A first advantage is that an efficient execution of a coding and/or decoding process to be performed on image information can be realized. This is because, as mentioned above, an initial forecast value of an MPS or LPS appearance probability in an image to be processed, which value is near to a corresponding actual value, is set when the coding or decoding process for pixel data is started. Thus, the error in the forecast value of an LPS appearance probability during a constant period from the beginning of the process, which error is the difference from the corresponding actual value, is small.

A second advantage is that an efficient coding and/or decoding process for each page of an original image to be processed can be realized. This is because an appropriate initial forecast value of an LPS appearance probability is reset (varied) for every time a coding and/or decoding process for a new page is started after a process such as mentioned above for one page is completed.

Further, the present invention is not limited to the above described embodiments, and variations and modifications may be made without departing from the scope of the present invention.

What is claimed is:

1. A data coding apparatus comprising:
   appearance probability forecasting means for forecasting an appearance probability that a predetermined symbol will appear in the data;
   initial value varying means for varying an initial value of said appearance probability in accordance with the type of said data; and
   coding means for arithmetically coding said data so as to provide coded data, based on said initial value of said appearance probability, the symbols actually described by said data, and said appearance probability forecast by said appearance probability forecasting means.

2. The data coding apparatus according to claim 1, wherein said predetermined symbol used by said appearance probability forecasting means is a least probability symbol, said least probability symbol being a symbol, a probability that such symbol will appear in the data being the lowest one possibility among symbols appearing in said data.

3. The data coding apparatus according to claim 1, wherein said coding means codes said data by means of an arithmetic coding system.

4. The data coding apparatus according to claim 1, wherein said data is pixel data.

5. The data coding apparatus according to claim 4, wherein said initial value varying means varies said initial value in accordance with the type of an image described by said pixel data, said type of the image is one of a character image and a picture image.

6. The data coding apparatus according to claim 1, further comprising a transmission means for transmitting said coded data provided by said coding means and said initial value set by said initial value varying means.

7. A data coding apparatus comprising:
   appearance probability forecasting means for forecasting an appearance probability that a predetermined symbol will appear in the data;
   initial value varying means for varying an initial value of said appearance probability in accordance with the type of said data; and
   coding means for coding said data so as to provide coded data, based on said initial value of said appearance probability, the symbols actually described by said data, and said appearance probability forecast by said appearance probability forecasting means, wherein said coding means divides a number line into two segments in a ratio in accordance with said initial value of said appearance probability, then said coding means selects one segment from said two segments in accordance with a symbol actually described by said data, then said coding means again divides said one selected segment into two other segments in a ratio in accordance with an appearance probability forecast by said appearance probability forecasting means, then said coding means again selects another segment from said two other segments in accordance with another symbol actually described by said data, and finally said coding means provides a code representing another selected segment finally selected as a result of repeating the process of dividing a segment into two other segments and selecting another segment from said two other segments.

8. The data coding apparatus according to claim 7, wherein said number line used by said coding means has a length of 1, the length of each of said selected segments of said real line is represented by a respective binary decimal fraction, the length of said selected segment is approximated by 1 by bitwise shifting of said binary decimal fraction representing said selected segment, when said length of said selected segment becomes less than a predetermined length less than 1, and the most significant bit of said binary decimal fraction representing said selected segment then determined is thus defined as said coded data.

9. A data coding apparatus comprising:
   appearance probability forecasting means for forecasting an appearance probability that a predetermined symbol will appear in the data;
   initial value varying means for varying an initial value of said appearance probability in accordance with the type of said data; and
   coding means for coding said data so as to provide coded data, based on said initial value of said appearance probability, the symbols actually described by said data, and said appearance probability forecast by said appearance probability forecasting means, wherein said appearance probability forecasting means forecasts said appearance probability with reference to a symbol described by surrounding data which is located around said data to be coded.

10. A data decoding apparatus comprising:
    appearance probability forecasting means for forecasting an appearance probability that a symbol described by coded data will be a predetermined symbol;
    initial value varying means for varying an initial value of said appearance probability in accordance with the type of original data to be obtained as a result of decoding of said coded data; and
    decoding means for arithmetically decoding said coded data so as to provide said original data, based on said initial value of said appearance probability, the symbols actually described by said original data, and said appearance probability forecast by said appearance probability forecasting means.

11. The data decoding apparatus according to claim 10, wherein said predetermined symbol used by said appearance probability forecasting means is a least probability symbol, said least probability symbol being a symbol, a probability that such symbol will appear in the data being the lowest possibility among symbols appearing in said data.

12. The data decoding apparatus according to claim 10, wherein said decoding means decodes said coded data by means of an arithmetic coding system.

13. The data decoding apparatus according to claim 10, wherein said original data is pixel data.

14. The data decoding apparatus according to claim 13, wherein said initial value varying means varies said initial value in accordance with the type of an image described by said pixel data, said type of the image is one of a character image and a picture image.

15. The data decoding apparatus according to claim 10, further comprising a receiving means for receiving said coded data and initial value transmitted from a transmission side.

16. A data decoding apparatus comprising:

appearance probability forecasting means for forecasting an appearance probability that a symbol described by coded data will be a predetermined symbol;

initial value varying means for varying an initial value of said appearance probability in accordance with the type of original data to be obtained as a result of decoding of said coded data; and decoding means for decoding said coded data so as to provide said original data, based on said initial value of said appearance probability, the symbols actually described by said original data, and said appearance probability forecast by said appearance probability forecasting means, wherein said decoding means divides a number line into two segments in a ratio in accordance with said initial value of said appearance probability, then said decoding means selects one segment from said two segments in accordance with said coded data, then said decoding means again divides said one selected segment into two other segments in a ratio in accordance with an appearance probability forecast by said appearance probability forecasting means, then said decoding means again selects another segment from said two other segments in accordance with said coded data, and finally said decoding means provides a symbol described by said coded data as a result of repeating the process of dividing a segment into two other segments and selecting another segment from said two other segments.

17. The data decoding apparatus according to claim 16, wherein said number line used by said decoding means has a length of 1, the most significant bit of a binary decimal fraction representing the length of each of said selected segments of said real line is defined as said coded data, said most significant bit being obtained as a result of bitwise shifting of said binary decimal fraction representing said selected segment done when the length of said selected segment is approximated by 1 when said length of said selected segment becomes less than a predetermined length less than 1.

18. A data decoding apparatus comprising:

appearance probability forecasting means for forecasting an appearance probability that a symbol described by coded data will be a predetermined symbol;

initial value varying means for varying an initial value of said appearance probability in accordance with the type of original data to be obtained as a result of decoding of said coded data; and decoding means for decoding said coded data so as to provide said original data, based on said initial value of said appearance probability, the symbols actually described by said original data, and said appearance probability forecast by said appearance probability forecasting means, wherein said appearance probability forecasting means forecasts said appearance probability with reference to a symbol described by surrounding original data which is located around said original data to be coded.

19. A data coding apparatus comprising:

appearance probability forecasting means for forecasting an appearance probability that a predetermined symbol will appear in the data;

initial value varying means for varying an initial value of said appearance probability in accordance with the type of said data; and coding means for coding said data so as to provide coded data, based on said initial value of said appearance probability, the symbols actually described by said data, and said appearance probability forecast by said appearance probability forecasting means, wherein said data is processed for each page, and said initial value varying means sets a respective initial value of an appearance probability fore each page in a first case, or coding means uses the appearance probability, obtained in the process of data coding for the current page, for data coding for the next page in a second case.

20. The data coding apparatus according to claim 19, wherein said first case is that the type of data differs for each page, and said second case is that the type of data of said current page is the same as the type of data of said next page.

21. The data coding apparatus according to claim 19, wherein said first and second case are determined as a result of a mutual communication of a protocol, said mutual communication being performed with a receiving side which receives the data coded by said data coding apparatus.

22. The data coding apparatus according to claim 19, further comprising a transmission means for transmitting said respective initial value for each page in said first case.

23. A data decoding apparatus comprising:

appearance probability forecasting means for forecasting an appearance probability that a symbol described by coded data will be a predetermined symbol;

initial value varying means for varying an initial value of said appearance probability in accordance with the type of original data to be obtained as a result of decoding of said coded data; and decoding means for decoding said coded data so as to provide said original data, based on said initial value of said appearance probability, the symbols actually described by said original data, and said appearance probability forecast by said appearance probability forecasting means, wherein said data is processed for each page, and said initial value varying means set a respective initial value of an appearance probability for each page in a first case, or said decoding means uses an appearance probability obtained in the process of data coding for a current page, for data coding for a next page in a second case.

24. The data decoding apparatus according to claim 23, wherein said first case is that the type of data differs for each page, and said second case is that the type of data of said current page is the same as the type of data of said next page.

25. The data decoding apparatus according to claim 23, wherein said first and second cases are determined as a result of a mutual communication of a protocol, said mutual communication being performed with a transmission side which sends the data to said data decoding apparatus after coding it.

26. The data decoding apparatus according to claim 23, further comprising a receiving means for receiving said respective initial value for each page in said first case.

27. A data coding method comprising steps of:
(a) forecasting an appearance probability that a symbol described by data will be a predetermined symbol;
(b) varying an initial value of said appearance probability in accordance with the type of said data; and
(c) arithmetically coding said data so as to provide coded data, based on said initial value of said appearance probability, the symbols actually described by said data, and said appearance probability forecast by said step (a).

28. The data coding method according to claim 27, wherein said predetermined symbol used by said step (a) is a least probability symbol, said least probability symbol being a symbol, a probability that such symbol will appear in the data being the lowest possibility among symbols appearing in said data.

29. The data coding method according to claim 27, wherein said step (c) codes said data by means of an arithmetic coding system.

30. The data coding method according to claim 27, wherein said data is pixel data.

31. The data coding method according to claim 30, wherein said step (b) sets said initial value in accordance with the type of an image described by said pixel data, said type of the image is one of a character image and a picture image.

32. The data coding method according to claim 27, further comprising a step (d) of transmitting said coded data provided by said step (c) and said initial value set by said step (b).

33. A data coding method comprising the steps of:
(a) forecasting an appearance probability that a symbol described by data will be a predetermined symbol;
(b) varying an initial value of said appearance probability in accordance with the type of said data; and
(c) coding said data so as to provide coded data, based on said initial value of said appearance probability, the symbols actually described by said data, and said appearance probability forecast by said step (a), wherein said step (c) divides a number line into two segments in a ratio in accordance with said initial value of said appearance probability, then said step (c) selects one segment from said two segments in accordance with a symbol actually described in said data, then said step (c) again divides said one selected segment into two other segments in a ratio in accordance with an appearance probability forecast by said step (a), then said step (c) again selects another segment from said two other segments in accordance with another symbol actually described by said data, and finally said step (c) provides a code representing another selected segment finally selected as a result of repeating the process of dividing a segment into two other segments and selecting another segment from said two other segments.

34. The data coding method according to claim 33, wherein said number line used by said step (c) has a length of 1, the length of each of said selected segments of said number line is represented by a respective binary decimal fraction, the length of said selected segment is approximated by 1 by bitwise sifting of said binary decimal fraction representing said selected segment when said length of said selected segment becomes less than a predetermined length less than 1, and the most significant bit of said binary decimal fraction representing said selected segment then determined is thus defined as said coded data.

35. A data coding method comprising the steps of:
(a) forecasting an appearance probability that a symbol described by data will be a predetermined symbol;
(b) varying an initial value of said appearance probability in accordance with the type of said data; and
(c) coding said data so as to provide coded data, based on said initial value of said appearance probability, the symbols actually described by said data, and said appearance probability forecast by said step (a), wherein said step (a) forecasts said appearance probability with reference to a symbol described by surrounding data which is located around said data to be coded.

36. A data decoding method comprising:
(e) forecasting an appearance probability that a symbol described by coded data will be a predetermined symbol;
(f) varying an initial value of said appearance probability in accordance with the type of original data to be obtained as a result of decoding of said coded data; and
(g) arithmetically decoding said coded data so as to provide said original data, based on said initial value of said appearance probability, the symbols actually described by said original data, and said appearance probability forecast by said step (e).

37. The data decoding method according to claim 36, wherein said predetermined symbol used by said step (e) is a least probability symbol, said least probability symbol being a symbol, a probability that such symbol will appear in the data being the lowest possibility among symbols appearing in said data.

38. The data decoding method according to claim 36, wherein said step (g) decodes said coded data by means of an arithmetic coding system.

39. The data decoding method according to claim 36, wherein said original data is pixel data.

40. The data decoding method according to claim 39, wherein said step (f) sets said initial value in accordance with the type of an image described by said pixel data, said type of the image is one of a character image and a picture image.

41. The data decoding method according to claim 36, further comprising a step (h) receiving said coded data and initial value transmitted from a transmission side which sends the data after coding, said sent data being then processed by said data decoding method.

42. A data decoding method comprising the steps of:
(e) forecasting an appearance probability that a symbol described by coded data will be a predetermined symbol;
(f) varying an initial value of said appearance probability in accordance with the type of original data to be obtained as a result of decoding of said coded data; and
(g) decoding said coded data so as to provide said original data, based on said initial value of said appearance probability, the symbols actually described by said original data, and said appearance probability forecast by said step (e), wherein said step (g) divides a number line into two segments in a ratio in accordance with said initial value of said appearance probability, then said step (g) selects one segment from said two segments in accordance with said coded data, then said step (g) again divides said one selected segment into two other segments in a ratio in accordance with an appearance probability forecast by said step (e), then said step (g) again selects another segment from said two other segments in accordance with said coded data, and finally said step (g) provides a symbol described by said coded data as a result of repeating the process of dividing a segment into two other segments and selecting another segment from said two other segments.

43. The data decoding method according to claim 42, wherein said number line used by said step (g) has a length of 1, the most significant bit of a binary decimal fraction representing the length of each of said selected segments of said number line is defined as said coded data, said most significant bit being obtained as a result of bitwise sifting of said binary decimal fraction representing said selected segment done when the length of said selected segment is approximated by 1 when said length of said selected segment becomes less than a predetermined length less than 1.

44. A data decoding method comprising the steps of:
(e) forecasting an appearance probability that a symbol described by coded data will be a predetermined symbol;
(f) varying an initial value of said appearance probability in accordance with the type of original data to be obtained as a result of decoding of said coded data; and
(g) decoding said coded data so as to provide said original data, based on said initial value of said appearance probability, the symbols actually described by said original data, and said appearance probability forecast by said step (e), wherein said step (e) forecasts said appearance probability with reference to a symbol described by surrounding original data which is located around said original data to be coded.

45. A data coding method comprising the steps of:
(a) forecasting an appearance probability that a symbol described by data will be a predetermined symbol;
(b) varying an initial value of said appearance probability in accordance with the type of said data; and
(c) coding said data so as to provide coded data, based on said initial value of said appearance probability, the symbols actually described by said data, and said appearance probability forecast by said step (a), wherein said data is processed for each page, and said step (b) sets a respective initial value of an appearance probability for each page in a first case, or said step (c) uses an appearance probability obtained in the process of data coding for the current page, for data coding for the next page in a second case.

46. The data coding method according to claim 45, wherein said first case is that the type of data differs for each page, and said second case is that the type of data of said current page is the same as the type of data of said next page.

47. The data coding method according to claim 45, wherein said first and second cases are determined as a result of a mutual communication of a protocol, which mutual communication being performed with a receiving side which receives the data coded by said data coding method.

48. The data coding method according to claim 45, further comprising a step (i) transmitting said respective initial value for each page in said first case.

49. A data decoding method comprising the steps of:
(e) forecasting an appearance probability that a symbol described by coded data will be a predetermined symbol;
(f) varying an initial value of said appearance probability in accordance with the type of original data to be obtained as a result of decoding of said coded data; and
(g) decoding said coded data so as to provide said original data, based on said initial value of said appearance probability, the symbols actually described by said original data, and said appearance probability forecast by said step (e), wherein said data is processed for each page, and said step (f) sets a respective initial value of an appearance probability for each page in a first case, or said step (g) uses the appearance probability obtained in a process of data coding for the current page, for data coding for the next page in a second case.

50. The data decoding method according to claim 49, wherein said first case is that the type of data differs for each page, and said second case is that the type of data of said current page is the same as the type of data of said next page.

51. The data decoding method according to claim 49, wherein said first and second cases are determined as a result of a mutual communication of a protocol, said mutual communication being performed with a transmission side which sends the data after coding, said sent data being then processed by said data decoding method.

52. The data decoding method according to claim 49, further comprising-a step (j) receiving said respective initial value for each page in said first case.

* * * * *